United States Patent [19]

Shiraishi et al.

[11] Patent Number: 4,947,411
[45] Date of Patent: Aug. 7, 1990

[54] PROGRAMMABLE CLOCK FREQUENCY DIVIDER

[75] Inventors: Taketora Shiraishi; Yukihiko Shimazu, both of Hyogo, Japan

[73] Assignee: Mitsubishi Denki Kabushiki Kaisha, Tokyo, Japan

[21] Appl. No.: 123,553

[22] Filed: Nov. 20, 1987

[30] Foreign Application Priority Data

Nov. 20, 1986 [JP] Japan .................. 61-278330

[51] Int. Cl.$^5$ .................. H03K 21/00; G06F 1/04
[52] U.S. Cl. .................. 377/47; 364/934.3; 364/934.71; 364/270.2
[58] Field of Search ............... 364/900 MS File, 200, 364/900; 377/47; 307/269

[56] References Cited

U.S. PATENT DOCUMENTS

| | | | |
|---|---|---|---|
| 4,231,104 | 10/1980 | St. Clair | 364/900 |
| 4,241,418 | 12/1980 | Stanley | 364/900 |
| 4,257,108 | 3/1981 | Igel | 364/900 |
| 4,321,687 | 3/1982 | Parsons et al. | 364/900 |
| 4,413,350 | 11/1983 | Bond et al. | 377/47 |
| 4,435,827 | 3/1984 | Kuze | 364/900 |
| 4,633,194 | 12/1986 | Kikuchi et al. | 377/47 |
| 4,719,593 | 1/1988 | Threewitt et al. | 364/900 |
| 4,819,164 | 4/1989 | Branson | 364/200 |
| 4,856,032 | 8/1989 | Klekotka et al. | 377/47 |

Primary Examiner—Gareth D. Shaw
Assistant Examiner—Gopal C. Ray
Attorney, Agent, or Firm—Lowe, Price, LeBlanc, Becker & Shur

[57] ABSTRACT

A clock frequency divider for generating a basic clock signal which provides operation timing for a semiconductor integrated circuit operating in accordance with a program. The clock frequency divider comprises a frequency-dividing factor register for storing a frequency-dividing factor which can be rewritten by the program, and a frequency-dividing circuit for frequency-dividing a source clock signal having a fixed frequency in accordance with the frequency-dividing factor stored in the frequency-dividing factor register, whereby a basic clock which provides a processing rate optimum for a program to be executed being obtained.

5 Claims, 4 Drawing Sheets

PROGRAMMABLE CLOCK FREQUENCY DIVIDER

BACKGROUND OF THE INVENTION

Field of the Invention

The present invention relates to a clock signal generator for a semiconductor integrated circuit using a clock signal as an operation timing signal, and particularly to a programmable clock frequency divider capable of frequency-dividing a source clock signal into a clock signal of a desired frequency by a program.

Description of the Prior Art

In semiconductor integrated circuits, a clock signal is used to synchronously operate the circuit components included in the semiconductor integrated circuit or to provide operation timing and control timing for the components.

FIG. 1 shows the arrangement of a conventional clock signal generator used in a semiconductor integrated circuit.

In FIG. 1, the conventional clock signal generator comprises a source clock generator 1 for generating a source clock signal having a fixed frequency and duty ratio, a frequency divider 2 for frequency-dividing the source clock signal from the source clock generator 1 in a predetermined ratio, an inverter 3 for inverting a clock-signal-selecting signal fed in through an input terminal 13, an AND gate 4 adapted to receive at one input thereof the output from the frequency divider 2 and at the other input thereof the output from the inverter 3 to perform logical product, and an AND gate 5 adapted to receive at one input thereof the source clock signal from the source clock generator 1 and at the other input thereof the clock-signal-selecting signal fed in through the input terminal 13 to perform logical product, and an OR gate 6 adapted to receive the outputs from the AND gates 4 and 5 to perform logical sum. The output from the OR gate 6 is delivered to a separate circuit 7 as a clock signal which provides operation timing. The separate circuit 7 has its operation timing controlled with the output from the OR gate 6 serving as a clock signal and performs predetermined functions.

This clock generator is used in digital information processing systems such as microprocessors, and the separate circuit 7 includes a CPU, a program storing device, and a program counter for providing addresses of the program storing device. For the clock signal selecting signal fed to the input terminal 13, any one, (e.g.,) B, of the plurality of bits forming the address of the program storing device included in the separate circuit 7 is used. If one bit B included in the bits forming the address is so used, a set of instruction words requiring high rate processing can be stored in a program storing region corresponding to an address with the value of the bit B being logically "1", while instruction words not requiring high rate processing can be stored in a program storing region corresponding to an address with the values of the bit B being logically "0": thus, in the program storing device, a program requiring high rate processing can be separated from a program not requiring high rate processing. The operation will be described.

When a program included in the programs stored in the program storing device, which requires high rate processing, is to be executed, the bit B included in the bits forming the address thereof has a value of logic "1" and a signal of logic "1" is fed to the input terminal 13. On the other hand, the source clock signal having a predetermined frequency generated from the source clock generator 1 is fed to the frequency dividing circuit 2 and AND gate 5. Since the AND gate 4 receives an inverted signal for logic "1" through the inverter 3, i.e., a signal of logic "0", the output from the AND gate 4 is logic "0". On the other hand, since the AND gate 5 receives a signal of logic "1" through the input terminal 13, the output from the AND gate 5 is a source clock signal, which is the output from the source clock generator 1. Therefore, the OR gate 6 delivers a signal, which is the source clock signal from the AND gate 5, to the separate circuit 7 as an operation timing signal. Thereby, the program requiring high rate processing can be executed in response to a high rate clock signal.

On the other hand, in the case of executing a program not requiring high rate processing, the value of the bit B fed to the input terminal 13 is logic "0", so that the AND gate 5 is in a disable state. on the other hand, since the AND gate 4 is fed with a signal of "1" through the inverter 3, the output from the AND gate 4 is the same with the output from the frequency divider 2. Therefore, the output from the AND gate 4 is delivered as such from the OR gate 6 since the output from the AND gate 5 is logic "0". At this time, since the frequency divider 2 is frequency-dividing the source clock signal from the source clock generator 1 in a predetermined ratio, a clock signal whose frequency is lower than that of the source clock signal is fed to the separate circuit 7 as an operation timing signal. Thereby, the program not requiring high rate processing can be executed with a low rate clock. By changing the rate of the basic clock signal which provides timing for the microprocessor between high and low rates in accordance with the program in the manner described above, power consumption due to switching in a CMOS semiconductor integrated circuit can be reduced without lowering the processing rate of the microprocessor. That is, in the semiconductor integrated circuit of CMOS structure, the power consumption is proportional to the number of times of switching, so that when the program not requiring high rate processing is processed at high rate, the program is completed in a short time, with excess switching taking place in response to clock signals, thus making it impossible to reduce power consumption; however, by changing the execution rate in accordance with the program, it is possible to reduce the number of times of said excess switching in the semiconductor integrated circuit of CMOS structure and hence to reduce power consumption.

In the arrangement of the conventional clock generator described above, only 2 kinds of source clock signals, i.e., one is the source clock signal and the other a frequency-divided one, can be used as clock signals for providing operation timing; thus, when the source clock has 10 MHz and the frequency-divided clock signal has 1 MHz, for example, it would be necessary that a program for which an execution rate of 2 MHz is sufficient be executed at an operation rate of 10 MHz and that a program for which an operation rate of 0.1 MHz is sufficient be executed at an operation rate of 1 MHz. By this reason, in semiconductor integrated circuits of CMOS structure, there has been a problem that there is a limit to reducing power consumption without lowering the program processing rate as a whole.

Further, since the selection of 2 kinds of basic clocks is effected using the value of an arbitrary bit B included in a plurality of bits forming an address of the program storing device, another problem is that the program execution rate cannot be controlled by the program itself written in a program storing region of the storing device.

In digital signal processing devices, a clock generator capable of generating a plurality of clock signals and making the processing rate of digital signals variable, is disclosed in Japanese Patent Publication No. 30572/1981. This reference corresponds to U.S. patent application Ser. No. 199954, disclosing an arrangement which generates a plurality of kinds of clock signals by utilizing delay in transfer of signals; however, the frequencies of the clock signals cannot be set by a program.

SUMMARY OF THE INVENTION

An object of the invention is to provide a programmable clock frequency divider which eliminates the problems inherent in the conventional clock generator described above and which, in a semiconductor integrated circuit, is capable of frequency-dividing a source clock signal with a frequency dividing factor of higher flexibility by using a program.

A programmable clock frequency divider according to the present invention comprises a frequency dividing factor register wherein a frequency dividing factor for a source clock signal is stored and the stored frequency dividing factor can be rewritten by a program, and a frequency dividing circuit for frequency-dividing the source clock signal in accordance with the frequency dividing factor stored in said frequency dividing factor register. The frequency dividing factor register and the frequency dividing circuit are provided on the same semiconductor integrated circuit chip.

With the arrangement made as described above, if a clock frequency dividing factor which provides an operation rate optimum for certain programs is stored in a program storing region of the program storing device in advance of a series of programs to be executed, at the time of execution of these programs the frequency dividing factor to be stored in the frequency dividing factor register can be written in accordance with the frequency dividing factor stored in the storing region; thus, since the frequency dividing circuit frequency-divides the source clock signal and delivers it as a basic clock signal, it is possible to obtain a basic clock signal which provides an operation rate optimum for program execution.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
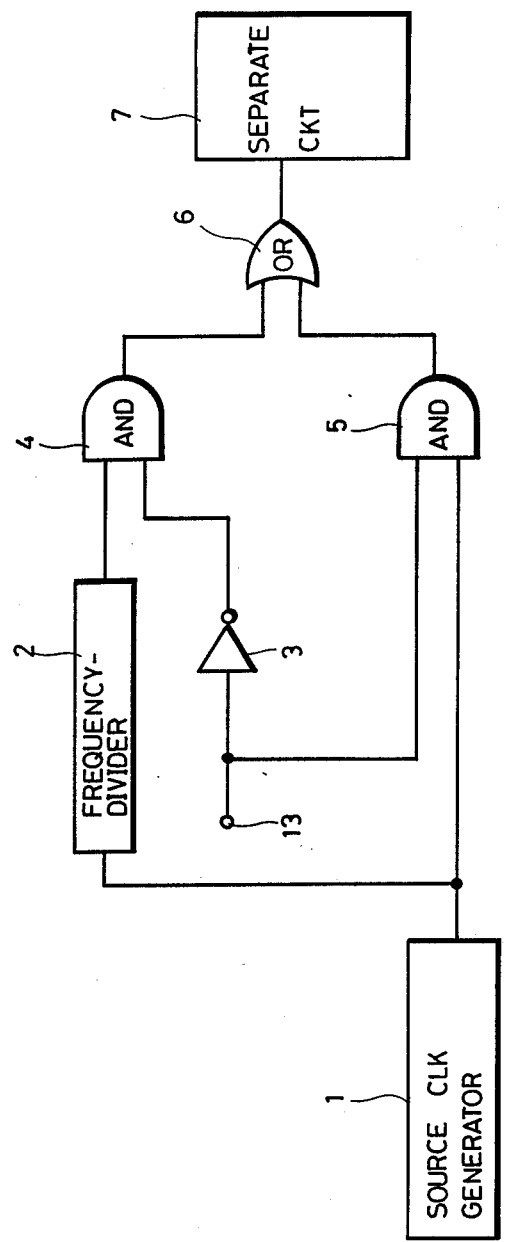
FIG. 1 is a view showing the arrangement of a conventional clock signal generator used in a semiconductor integrated circuit.
Figure 2:
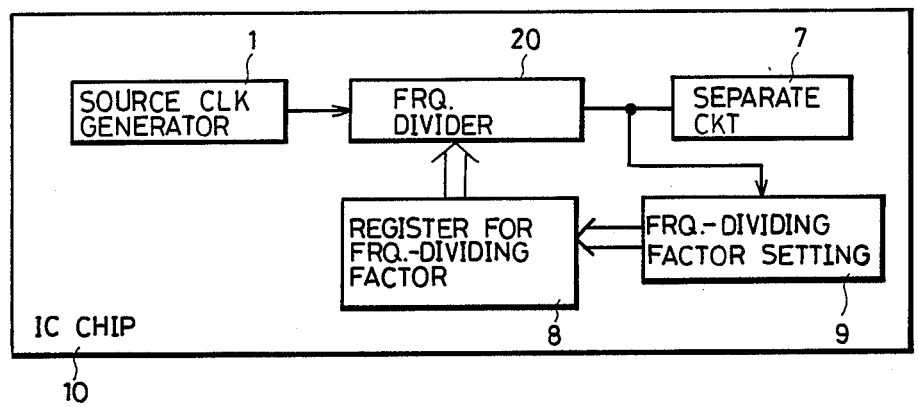
FIG. 2 is a block diagram showing a schematic arrangement of a programmable clock frequency divider according to an embodiment of the present invention.

FIG. 2 is a block diagram showing an arrangement of a programmable clock frequency divider according to an embodiment of the present invention. The programmable clock frequency divider according to the present invention comprises a source clock generator 1 for generating a source clock signal having a predetermined frequency and duty ratio, a frequency dividing circuit 20 for frequency-dividing the source clock signal received from the source clock generator 1 in accordance with a frequency dividing factor from a frequency dividing factor register 8 to feed the same to a separate circuit 7 and a frequency dividing factor setting means 9 as a basic clock signal, the separate circuit 7 being, e.g., of CMOS or MOS structure for performing predetermined functions using the basic clock signal from the frequency dividing circuit 20 as an operation timing signal, the frequency dividing factor setting means 9 being adapted to operate in response to the clock signal from the frequency dividing circuit 20 to set a frequency dividing factor suitable for a program to be executed and write it into a frequency dividing factor register 8, the frequency dividing factor register 8 being adapted to define the frequency dividing factor for the frequency dividing circuit 20. The source clock generator 1, frequency dividing circuit 20, separate circuit 7, frequency dividing factor register 8 and frequency dividing factor setting means 9 are integrated on the same semiconductor integrated circuit chip 10.

Figure 3:
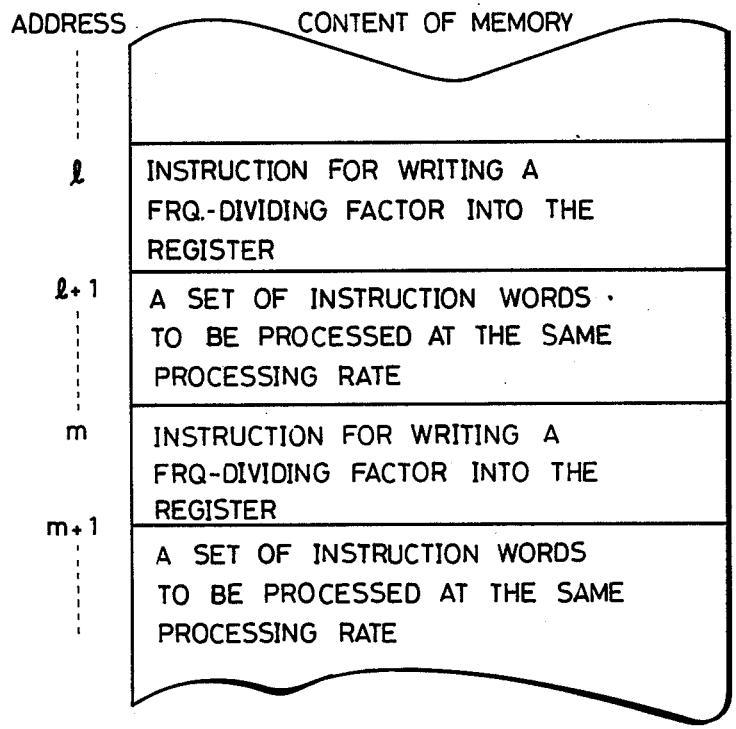
FIG. 3 is a diagram showing an example of the relationship between addresses and their contents in a program storing device.

FIG. 3 is a diagram showing addresses for program storing regions of a storing device and their contents, illustrating an example of a program for setting frequency dividing factors by using the frequency dividing factor setting means 9 shown in FIG. 2. Stored in the address 1 of the program storing device is an instruction for writing a desired frequency dividing factor to the frequency dividing factor register 8. Stored in a series of storing regions starting from the address 1+1 are instruction words to be processed at the same processing rate corresponding to the frequency dividing factor designated by the instruction in the address 1. Stored in the address m is an instruction for writing a frequency dividing factor different from that designated by the instruction in the address 1 into the register 8. Stored in a series of regions starting from the address m+1 are a series of instruction words to be processed at a processing rate conforming to the frequency dividing factor designated by the instruction in the address m.

In one case this storing device is included in the separate circuit 7 of the semiconductor integrated circuit chip 10 and in another case it is provided outside the semiconductor integrated circuit chip 10. That is, depending upon what kind of circuit arrangement the separate circuit 7 includes, whether or not the program storing device is to be included in the semiconductor integrated circuit chip 10 is determined. Further, the arrangement of the frequency dividing factor setting means 9 is changed with the arrangement of the separate circuit 7. That is, when the separate circuit 7 has a CPU, such as a microprocessor, and a program storing device, the frequency dividing factor setting means includes the CPU and the program storing device. In that case, when the CPU accesses the address 1 of the program storing device, it writes the frequency dividing factor designated by the instruction in the address 1 into the frequency dividing factor register 8.

When the separate circuit 7 is a logic circuit (logic gate array) or a simple memory such as random access memory, the frequency dividing factor setting means 9 comprises latch means and writing means for writing into the frequency dividing factor register 8 information it receives from the program storing region and CPU provided external to the chip 10.

The source clock generator 1 shown in FIG. 2 may be installed on the semiconductor integrated circuit chip 10 or may be an input terminal for simply receiving a source clock fed in from an exterior of the chip. That is, in that case also, it is determined by the arrangement of the separate circuit 7 which operates with the basic signal $\theta$ (56) from the frequency dividing circuit 20 serving as an operation timing signal.

As for the separate circuit 7, therefore, various circuit arrangements may be implemented as far as they satisfy the condition that they operate using the basic clock signal $\theta$ (56) from the frequency dividing circuit 20 as an operation timing signal. However, the separate circuit 7 preferably has a CMOS structure.

In other words, a programmable clock frequency divider according to the present invention is intended to generate a basic clock signal in a digital signal processing system for executing programs and is used in a system having at least a CPU and a program storing device for storing programs.

The operation of a programmable clock frequency divider according to an embodiment of the present invention will be described with reference to FIGS. 2 and 3. The source clock generating circuit 1 produces a clock signal $\theta 0$ (50) having a predetermined frequency and duty ratio and feeds it to the frequency dividing circuit 20 through a signal line 50. The frequency dividing factor register 8 has a required frequency dividing factor written thereto by the frequency dividing factor setting means 9. In accordance with the frequency dividing factor stored in the frequency dividing factor register 8, the frequency dividing circuit 20 frequency-divides the source clock signal $\theta 0$ (50) from the source clock generator 1 and delivers it on a signal line 56 as a basic clock signal $\theta$ to be fed to the separate circuit 7 and the frequency dividing factor setting means 9. The separate circuit 7 and the frequency dividing factor setting means 9 operate in accordance with the instruction words stored in the program storing region by using the basic clock signal $\theta$ from the frequency dividing circuit 20 as a basic timing signal. The setting of frequency dividing factors by the frequency dividing factor setting means 9 is effected as follows.

Referring to FIG. 3, a series of instruction words to be processed at the same processing rate are written in regions starting from the address $1+1$ of the program storing device. At this time, an instruction for writing into the frequency dividing factor register 8 the frequency dividing factor which provides said same processing rate is written in the address 1. A series of instruction words to be processed at a processing rate different from the processing rate designated by the instruction in the address 1 are written in the address $m+1$. An instruction for writing into the frequency dividing factor register 8 the frequency dividing factor which provides a processing rate optimum for processing instruction words from the address $m+1$ has been written in the address m. Therefore, during the successive execution of the programs by the CPU, when the CPU accesses the address 1, the program corresponding to the address 1 is executed. The instruction stored in the address 1 is an instruction for writing the predetermined frequency dividing factor into the frequency dividing factor register 8. Therefore, information indicating the corresponding frequency dividing factor is written from the frequency dividing factor setting means 9 into the frequency dividing factor register 8 in response to said instruction. Upon completion of the writing of the frequency dividing factor into the frequency dividing factor register 8, the instructions in the ranges starting from the address $1+1$ are successively executed. At this time, a clock signal $\theta$ which has been frequency-divided in accordance with the frequency dividing factor designated by the instruction in the address 1 is delivered from the frequency dividing circuit 20, so that said instructions are processed with the same basic clock signal. Next, when the address m is accessed, an instruction for writing a different frequency dividing factor into the frequency dividing factor register 8 is generated. In response to this frequency dividing factor writing instruction, the frequency dividing factor setting means 9 writes the corresponding frequency dividing factor into the frequency dividing factor register 8. Then, the instruction in the address $m+1$ will be processed in response to a new basic clock having this new processing rate.

As for the frequency dividing factor setting means 9, various arrangements may be contemplated, depending on the structure of the separate circuit 7. That is, when the separate circuit 7 includes a CPU (central processing unit, or microprocessor), there may be contemplated an arrangement which simply receives the frequency dividing factor generated from the CPU and writes it into the frequency dividing factor register 8 when the CPU accesses the program storing device to execute the program. There may be contemplated another arrangement which, in response to the instruction from the CPU, the means 9 itself generates internally the corresponding frequency dividing factor and writes it into the frequency dividing factor register 8. When the CPU and the program storing device are not provided on the semiconductor integrated circuit chip 10, there may be contemplated an arrangement which receives frequency dividing information fed from outside to write the same into the register 8, or an arrangement which, in response to an instruction from outside, the setting means 9 itself generates a frequency dividing factor and writes it into the frequency dividing factor register 8. Further, a CPU includes a program storing device, the CPU functions as the setting means 9. Therefore, it follows that it is only necessary for the frequency dividing factor setting means 9 to have at least the function of writing the corresponding frequency dividing factor into the frequency dividing factor register 8 in response to the frequency dividing factor writing instruction written in the program storing device.

With the arrangement made as described above, a frequency dividing factor which provides a processing rate suitable for a program to be executed can be accurately set and hence each program can be executed at an optimum processing rate.

Figure 4:
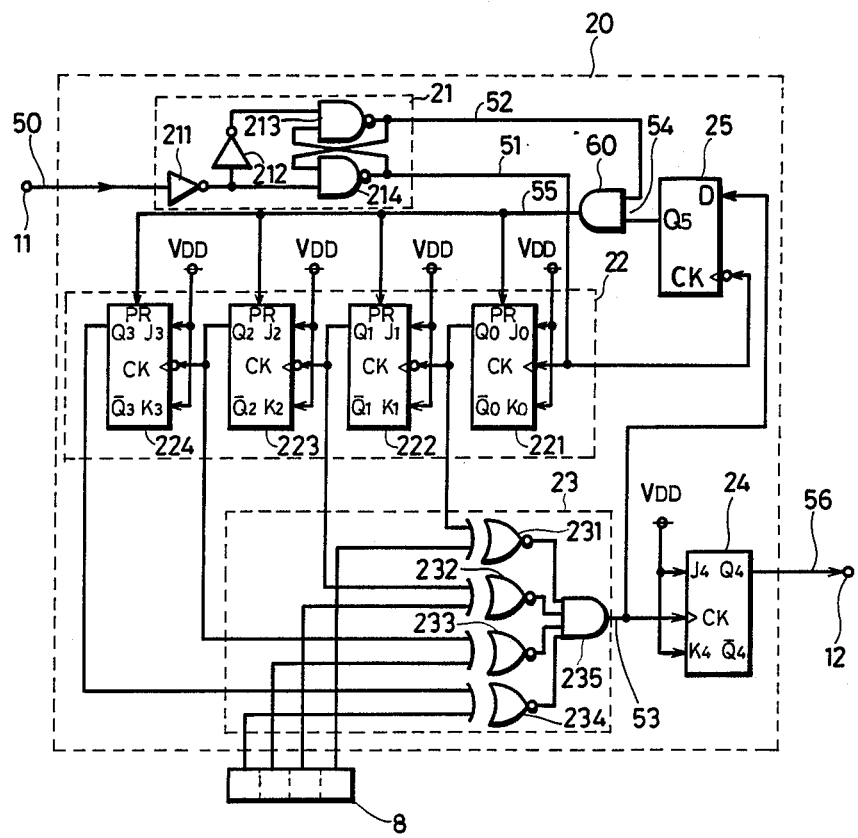
FIG. 4 is a view showing an example of a specific arrangement of the frequency dividing circuit shown in FIG. 2.

FIG. 4 is a view showing an example of a specific example of the frequency dividing circuit 20 shown in FIG. 2. The arrangement and operation of the frequency dividing circuit according to an embodiment of the present invention will be described with reference to FIG. 4.

The frequency dividing circuit 20 comprises a two-phase non-overlapping clock generating circuit 21 for converting a source clock $\theta 0$ (50) supplied through a terminal 11 into two-phase non-overlapping clock signal $\theta 1$ (51) and $\theta 2$ (52), a pre-settable binary counter 22 for counting clock signals $\theta 1$ (51) from the non-overlapping clock generating circuit 21, a comparator circuit 23 adapted to receive the frequency dividing factor stored in the frequency dividing factor register 8 and the output from the binary counter 22 to decide whether or not they coincide with each other, a JK flip-flop 24 adapted to invert its internal state (Q4 output) in response to the rise of a coincidence signal E (53) from the comparator circuit 23, thereby generating a basic clock signal $\theta$ (56) whose duty ratio is 50 with the "H" and "L" periods being equal to each other and feeding it to the separate circuit 7 through the output terminal 12, and a D flip-flop 25 for delaying the coincidence signal E (53) from the comparator circuit 23 until the clock signal $\theta 1$ (51) falls, and presetting the binary counter 22 all to 1 (that is, a maximum value of count) through logical product of it and the clock signal $\theta 2$ (52) by an AND gate 60.

The non-overlapping clock generating circuit 21 comprises an inverter 211 for inverting the source clock signal $\theta 0$ (50) supplied through the input terminal 11, an inverter 212 for inverting the output from the inverter 211 to feed it to one input of a NAND gate 213, a NAND gate 214 for receiving the output from the inverter 211 and the output from the NAND gate 213 to perform a NAND operation on them, and a NAND gate 213 for receiving the output from the inverter 212 and the output from the NAND gate 214 to perform a NAND operation on them. The NAND gate 214 produces the clock signal $\theta 1$ (51), while the NAND gate 213 produces the clock $\theta 2$ (52).

The binary counter 22 includes 4 JK flip-flops 221, 222, 223 and 224. The JK flip-flop 221 receives the clock signal $\theta 1$ (51) from the NAND gate 214 and has its J0 input and K0 input connected to a power source voltage $V_{DD}$ and its Q0 output is fed to an EXNOR gate 231 and the clock input CK of the JK flip-flop 222. The JK flip-flop 222 has its J1 input and K1 input connected to the power source voltage $V_{DD}$ and receives at its clock input CK the Q0 output from the JK flip-flop 221, and its Q1 output is fed to the EXNOR gate 232 and to the clock input CK of the JK flip-flop 223. The JK flip-flop 223 has its J2 input and K2 input connected to the power source voltage $V_{DD}$ and receives at its clock input CK the Q1 output from the flip-flop 222, and its Q2 output is fed to an EXNOR gate 233 and to the clock input CK of th JK flip-flop 224. The JK flip-flop 224 has its J3 input and K3 input connected to the power source voltage $V_{DD}$ and its CK input connected to the Q2 output of the JK flip-flop 223, and its Q3 output is fed to an EXNOR gate 234. Therefore, the binary counter delivers its output in the form of $Q3 \cdot 2^3 + Q2 \cdot 2^2 + Q1 \cdot 2^1 + Q0 \cdot 2^0$ in the binary.

The comparator circuit 23 for deciding whether or not the output form the binary counter 22 coincides with the output from the frequency dividing factor register 8, contains 4 EXNOR gates 231, 232, 233 and 234, and a four-input AND gate 235. The EXNOR gate 231 generates a signal of logic "1" when it receives the least significant bit from the frequency dividing factor register 8 and the Q0 output form the JK flip-flop 221 and finds them to coincide with each other. The EXNOR gate 232 generates a signal of logic "1" when it receives the next least significant bit from the frequency dividing factor register 8 and the Q1 output from the JK flip-flop 222 and finds them to coincide with each other. The EXNOR gate 233 generates a signal of logic "1" when it receives the third least significant bit from the frequency dividing factor register 8 and the Q2 output from the JK flip-flop 223 and finds them to coincide with each other. The EXNOR gate 234 generates a signal of logic "1" when it receives the most significant bit from the frequency dividing factor register 8 and the Q3 output from the JK flip-flop 224 and finds them to coincide with each other. The AND gate 235 performs logical product of the outputs from the EXNOR gates 231 through 234 and delivers its output. Therefore, the AND gate 235 feeds a signal of logic "1" onto the signal line 53 only when the counted value of the binary counter 22 coincides with the frequency dividing factor stored in the frequency dividing factor register 8.

All the JK flip-flops 221 through 224 in the binary counter 22 receive respective inputs at their preset inputs through the signal line 55, and their outputs are preset all to 1 when they are fed with a signal of logic "1" at their preset inputs. Of the JK flip-flops 221, 222, 223 and 224, only the JK flip-flop 221 inverts its output state in response to the rise of the clock signal fed to its clock input CK, while the other flip-flops 222 through 224 invert their output states in response to the fall of the clock signal fed to their clock inputs CK.

Figure 5:
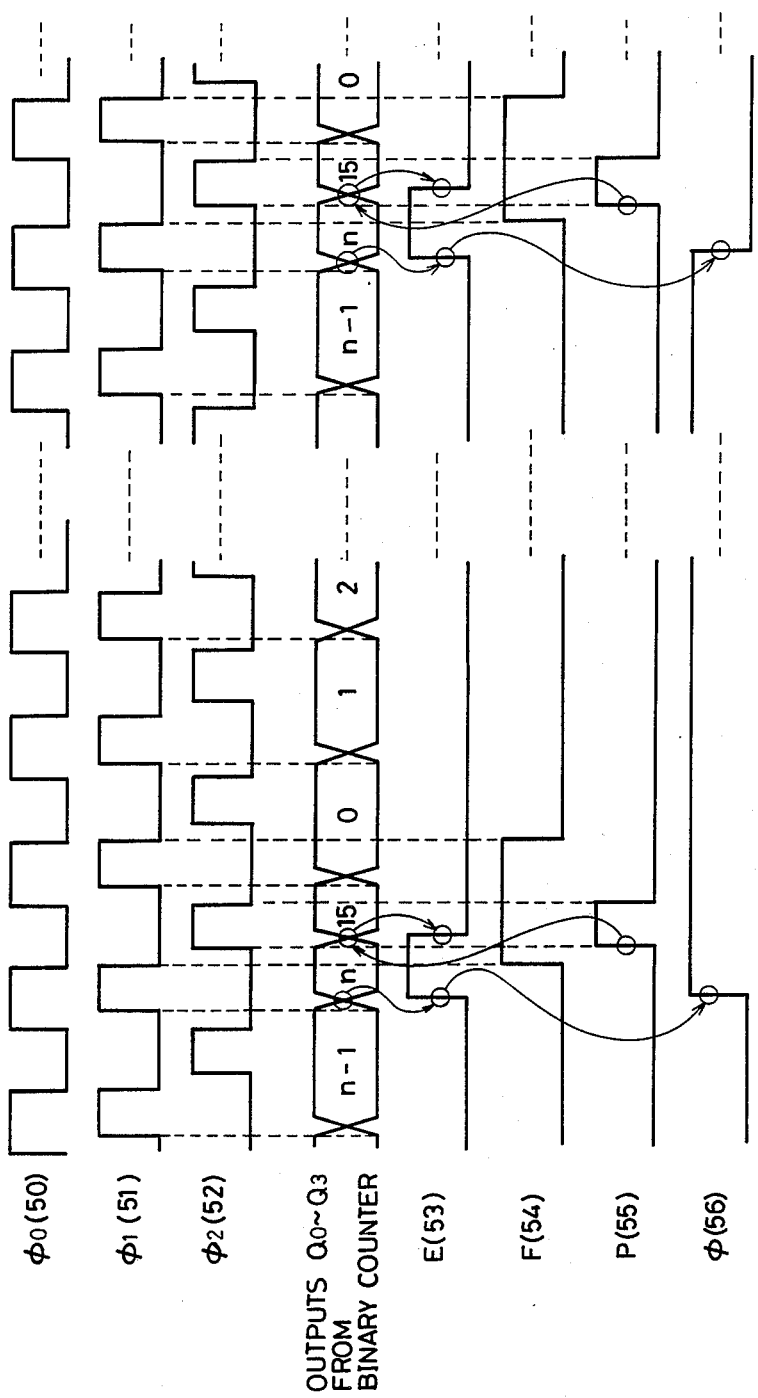
FIG. 5 is a waveform diagram showing operation of the frequency dividing circuit shown in FIG. 4.

FIG. 5 is a timing waveform diagram showing the operation of the frequency dividing circuit shown in FIG. 4. The frequency dividing circuit which is an embodiment of the present invention will be described with reference to FIGS. 4 and 5. The source clock signal $\theta 0$ (50) is fed to the inverter 211 through the input terminal 11. Each of the NAND gates 213 and 214 delivers a signal of logic "0" only when two inputs it receives are "1". That is, the NAND gates 213 and 214 form a flip-flop, feeding the signal lines 51 and 52 with two-phase non-overlapping clock signals $\theta 1$ (51) and $\theta 2$ (52), respectively, which do not overlap with each other. The clock signals $\theta 1$ (51) delivered from the NAND gate 214 are fed to the binary counter 22 which then counts them. The clock signals $\theta 1$ (51) are fed to the clock input CK of the JK flip-flop 221 and also to the clock input CK of the D flip-flop 25. The JK flip-flop 221 inverts its output state in response to the rise of the clock signal $\theta 1$ (51), while the other JK flip-flops 222 through 224 invert their output states in response to the fall of clock signals fed to their inputs. Therefore, the outputs Q0 through Q3 from the binary counters 221 through 224 indicate the number of the clock signal $\theta 1$ (51) counted in binary $Q3 \cdot 2^3 + Q2 \cdot 2^2 + Q1 \cdot 2^1 + Q0 \cdot 2^0$. On the other hand, the frequency dividing factor register 8 has a frequency dividing factor (n) written thereto by the frequency dividing factor setting means 9 in advance. The content of the frequency dividing factor register 8 is fed to the comparator circuit 23, whereby whether or not it coincide with the Q0 through Q3 outputs from the binary counter 22 is decided. If the counted values Q0 through Q3 of the binary counter 22 coincide with the frequency dividing factor (n) stored in the frequency dividing factor register 8, a coincidence signal E (53) is delivered from the AND gate 235. This coincidence signal E is fed to the D input of the D flip-flop 25. Since the D flip-flop 25 delivers from the output Q5 the signal fed to the input D in response to the fall of the clock signal $\theta1$ (51), it delivers from its output Q5 a signal F (54) which rises in synchronization with the fall of the signal $\theta1$ (51). The "H" state of the Q5 output of the D flip-flop 25 is set after the coincidence signal E (53) has been raised and after the clock signal $\theta1$ (51) has fallen. The AND gate 60 receives the clock $\theta2$ (52) from the NAND gate 213 and the output F (54) from the Q5 output of the D flip-flop and takes logical product of them and delivers its output. Therefore, at the time when both signals turn to "H", the preset signal P (55) rises, whereby the internal states of the 4 JK flip-flips of the binary counter 22 are preset all to 1, that is, all the Q0 through Q3 are preset to 1, and the output of the binary counter 22 is preset to binary 1111 or decimal 15. When the output of the binary counter 22 becomes 15 (binary 1111), the content (n) of the frequency dividing factor register 8 turns out of coincidence with the output from the binary counter 22, causing the coincidence signal E (53) from the comparator circuit 23 to fall. The fall of the coincidence signal E (53) is delayed by the D flip-flop 25 until the fall of the clock signal $\theta1$ (51), causing the output signal F (54) from the D flip-flop 25 to fall in response to the fall of the clock signal $\theta1$ (51). At this time, the preset signal P (55) which represents the logical product of the clock signal $\theta2$ (52) and the output signal F (54) from the D flip-flop 25 has already fallen in response to the fall of the clock signal $\theta2$ (52); therefore, the preset state of the binary counter 22 has been canceled. Thereafter, in accordance with the rise of the clock signal $\theta1$ (51), the output from the binary counter 22 repeats $0 \to 1 \to 2 \to \ldots \to n/15 \to 0 \to \ldots$, as shown in FIG. 5; thus, the coincidence signal E (53) rises at every (n+1)-th rise of the clock signal $\theta1$ (51). The JK flip-flop 24 inverts the output signal at every rise of the coincidence signal E (53) from the comparator circuit 23 and delivers a clock whose frequency is $\frac{1}{2}$ times the frequency of the coincidence signal E (53) with "H" and "L" periods being equal to each other, serving as a basic clock $\theta$ (56), from its output terminal 12. As described above, in this embodiment, a clock $\theta0$ (50) having a fixed frequency f is frequency-divided to provide a basic clock $\theta$ (56) having a frequency of $f/(2(n+1))$ in accordance with a value of n (n being from 0 to 15) stored in the frequency dividing factor register 8, the frequency-divided basic clock $\theta$ (56) being used for timing control of the separate circuit 7 installed on the semiconductor integrated circuit chip 10.

In the manner described above, it is possible to frequency-divide the source clock $\theta0$ (50) to provide a clock of a desired frequency, making it possible to obtain a processing rate matching with a program to be executed.

In the embodiment described above, the frequency dividing factor register has been shown consisting of 4 bits and hence the binary counter 22 also 4 bits; however, the invention is not limited thereto. If larger frequency dividing factors are required, they may have a larger number of bits. If, on the other hand, so large frequency dividing factors are not required, the frequency dividing factor register and the binary counter having a smaller number of bits may be used.

As has so far been described, according to the present invention, a frequency dividing factor for a clock signal is set by a program and a source clock signal is frequency-divided in accordance with this set frequency dividing factor, this frequency-divided basic clock signal being used as an operation timing signal; therefore, there is an advantage that a semiconductor integrated circuit can be operated at a rate optimum for a program to be executed, with power consumption saved with much more attention paid than in the prior art. Further, since the frequency divider is installed in the semiconductor integrated circuit, there is no need to provide additional parts outside the semiconductor integrated circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A programmable clock frequency divider installed in a semiconductor integrated circuit using as an operation timing signal a basic signal produced from a source clock having a fixed frequency supplied from a source clock supply, said frequency divider being used to generate said basic clock signal, said semiconductor integrated circuit being adapted to operate in accordance with a program stored in a program storing device, said programmable clock frequency divider comprising:

a frequency dividing factor register means for storing source clock frequency-dividing factor data for preparing said basic clock signal in response to a frequency dividing factor signal output from said frequency-dividing factor register means, said frequency-dividing factor register means being responsive to said program storing device so that said frequency-dividing factor data is capable of being rewritten by the program stored in said program storing device, and frequency dividing circuit means coupled to said source clock supply and said register means for frequency-dividing said source clock signal in accordance with the frequency-dividing factor signal from said frequency-dividing factor register means so as to derive a desired basic clock signal.

2. A programmable clock frequency divider as set forth in claim 1, wherein:

said program storing device stores an instruction for writing into said frequency-dividing factor register means frequency-dividing factor data which provide a desired basic clock and at least one program to be executed in response to the basic clock signal generated in accordance with the frequency-dividing data designated by said writing instruction, in such a manner that said writing instruction and said at least one program form a group.

3. A programmable clock frequency divider as set forth in claim 1, wherein:

said frequency dividing factor register means and said frequency dividing circuit means are integrated on the same semiconductor chip as that of the semiconductor integrated circuit which operates in response to the basic clock signal generated by said frequency-dividing circuit means.

4. A programmable clock frequency divider as set forth in claim 1, wherein:

said semiconductor integrated circuit is a circuit device of MOS structure.

5. A programmable clock frequency divider as set forth in claim 1, wherein:

said frequency dividing circuit means comprises means for receiving said source clock signal to generate a non-overlapping two-phase clock signal consisting of first clock signals and second clock signals, means for counting said first clocks signals, means for deciding whether or not the frequency dividing factor data stored in said frequency-dividing factor register means coincides with the value counted by said counting means and developing a signal in response thereto, means for delivering a signal whose signal level changes in response to the coincidence signal from said decision means to provide the basic clock signal, and means for presetting said count means to a maximum value which can be counted by said count means in response to the coincidence signal from said decision means and said second clock signal.

* * * * *